(12) United States Patent
Zhu et al.

(10) Patent No.: US 11,881,442 B2
(45) Date of Patent: Jan. 23, 2024

(54) SOI ACTIVE TRANSFER BOARD FOR THREE-DIMENSIONAL PACKAGING AND PREPARATION METHOD THEREOF

(71) Applicants: FUDAN UNIVERSITY, Shanghai (CN); SHANGHAI INTEGRATED CIRCUIT MANUFACTURING INNOVATION CENTER CO., LTD, Shanghai (CN)

(72) Inventors: Bao Zhu, Shanghai (CN); Lin Chen, Shanghai (CN); Qingqing Sun, Shanghai (CN); Wei Zhang, Shanghai (CN)

(73) Assignee: Shanghai Integrated Circuit Manufacturing Innovation Center Co., Ltd., Shanghai (CN)

( * ) Notice: Subject to any disclaimer, the term of this patent is extended or adjusted under 35 U.S.C. 154(b) by 359 days.

(21) Appl. No.: 17/052,857
(22) PCT Filed: Jul. 2, 2020
(86) PCT No.: PCT/CN2020/099978
§ 371 (c)(1),
(2) Date: Mar. 23, 2021
(87) PCT Pub. No.: WO2022/000433
PCT Pub. Date: Jan. 6, 2022

(65) Prior Publication Data
US 2023/0097450 A1 Mar. 30, 2023

(30) Foreign Application Priority Data
Jun. 30, 2020 (CN) .......................... 202010620317.0

(51) Int. Cl.
*H01L 21/8234* (2006.01)
*H01L 29/06* (2006.01)
(Continued)

(52) U.S. Cl.
CPC ...... *H01L 23/481* (2013.01); *H01L 21/76841* (2013.01); *H01L 21/76898* (2013.01);
(Continued)

(58) Field of Classification Search
CPC . H01L 23/49827; H01L 21/486; H01L 21/84; H01L 27/12032; H01L 21/823871;
(Continued)

(56) References Cited

U.S. PATENT DOCUMENTS 8,354,678 B1   1/2013  Fox et al.
9,704,784 B1 * 7/2017  Lagouge ........... H01L 21/76841
(Continued)

FOREIGN PATENT DOCUMENTS

| CN | 102543829 A | 7/2012 |
| CN | 103378033 A | 10/2013 |
| CN | 103515302 A | 1/2014 |

OTHER PUBLICATIONS

International Search Report and Written Opinion for PCT Application No. PCT/CN2020/099978; China National Intellectual Property Administration; Beijing, China; dated Mar. 25, 2021.
(Continued)

*Primary Examiner* — John A Bodnar
(74) *Attorney, Agent, or Firm* — Thomas E. Lees, LLC

(57) ABSTRACT

Disclosed is an SOI active interposer for three-dimensional packaging and a fabrication method thereof. An SOI substrate is used as the substrate, and a CMOS inverter is formed on the top silicon of the SOI by using standard integrated circuit manufacturing processes, so that short channel effect and latch-up effect can be suppressed. A via hole structure is etched on the SOI substrate between the PMOS and NMOS transistors of the CMOS inverter, which on the one hand can be used as a conductive channel between the chips in a vertical direction, and on the other hand, can be used as an electrical isolation layer between the PMOS and NMOS transistors.

8 Claims, 7 Drawing Sheets

(51) Int. Cl.

| | |
|---|---|
| *H01L 29/66* | (2006.01) |
| *H01L 29/08* | (2006.01) |
| *H01L 21/306* | (2006.01) |
| *H01L 29/423* | (2006.01) |
| *H01L 21/02* | (2006.01) |
| *H01L 29/786* | (2006.01) |
| *H01L 29/78* | (2006.01) |
| *H01L 29/40* | (2006.01) |
| *H01L 29/775* | (2006.01) |
| *H01L 27/088* | (2006.01) |
| *H01L 23/48* | (2006.01) |
| *H01L 21/768* | (2006.01) |
| *H01L 21/8238* | (2006.01) |
| *H01L 21/84* | (2006.01) |
| *H01L 27/092* | (2006.01) |
| *H01L 27/12* | (2006.01) |

(52) U.S. Cl.
CPC ...... *H01L 21/823871* (2013.01); *H01L 21/84* (2013.01); *H01L 27/092* (2013.01); *H01L 27/1203* (2013.01)

(58) Field of Classification Search
CPC ............. H01L 27/092; H01L 21/76898; H01L 23/481
See application file for complete search history.

(56) References Cited

U.S. PATENT DOCUMENTS

| | | | | |
|---|---|---|---|---|
| 2003/0203546 | A1* | 10/2003 | Burbach | H01L 21/743 438/405 |
| 2006/0278992 | A1* | 12/2006 | Trezza | H01L 21/76898 257/E21.705 |
| 2008/0164573 | A1* | 7/2008 | Basker | H01L 23/055 257/E23.09 |
| 2013/0015504 | A1 | 1/2013 | Kuo et al. | |
| 2013/0093098 | A1 | 4/2013 | Yang et al. | |
| 2013/0252416 | A1* | 9/2013 | Takeda | H01L 23/481 438/630 |
| 2014/0264630 | A1 | 9/2014 | Huang et al. | |
| 2014/0327151 | A1* | 11/2014 | Yang | H01L 23/481 438/653 |
| 2021/0043557 | A1* | 2/2021 | Lee | H01L 23/481 |

OTHER PUBLICATIONS

International Search Report and Written Opinion English Translation for PCT Application No. PCT/CN2020/099978; China National Intellectual Property Administration; Beijing, China; dated Mar. 25, 2021.

Chinese first Office action and search report for Chinese Patent Application No. 202010620317.0; China National Intellectual Property Administration; Beijing, China; dated Apr. 26, 2023.

* cited by examiner

SOI ACTIVE TRANSFER BOARD FOR THREE-DIMENSIONAL PACKAGING AND PREPARATION METHOD THEREOF

TECHNICAL FIELD

The present invention relates to the field of integrated circuit packaging, and specifically relates to an SOI active interposer for three-dimensional packaging and a fabrication method thereof.

BACKGROUND OF THE INVENTION

With the rapid development of integrated circuit technology, microelectronic packaging technology has gradually become a main factor restricting the development of semiconductor technology, in order to achieve high-density electronic packaging, better performance and lower overall cost, researchers have developed a series of advanced packaging technologies. Among them, the three-dimensional system-in-package technology has good electrical performance and high reliability, and can achieve high-density packaging, and is widely used in various high-speed circuits and miniaturized systems.

Through Silicon Via (TSV) interposer technology is a new technology for stacking chips in three-dimensional integrated circuits to achieve interconnection. Many vertical interconnecting via holes and subsequent redistribution layer (RDL) are made on silicon wafers to achieve electrical interconnection between different chips. In addition, TSV interposer technology is divided into two types: active interposer and passive interposer. Among them, the active interposer has active components, and the passive interposer lacks active components. TSV interposer technology can maximize stacking density of chips in three dimensional directions, obtain shortest interconnection lines between chips and smallest external size, and greatly improve chip speed and have low power consumption performance. Thus it is currently the most attractive one in electronic packaging technologies. However, fabricating CMOS devices, such as CMOS inverters, on silicon-based interposers is prone to short-channel effect and latch-up effect, which affect device performance.

SUMMARY OF THE INVENTION

In order to solve the above problems, embodiments of the present invention discloses an SOI active interposer for three-dimensional packaging, comprising: an SOI substrate; a CMOS inverter, including a PMOS transistor and an NMOS transistor and formed on the SOI substrate; an SOI via hole formed between the PMOS transistor and the NMOS transistor and penetrating through the SOI substrate; a first insulating medium covering the PMOS transistor and the NMOS transistor; a second insulating medium, formed on the sidewall of the SOI via hole and the surface of the first insulating medium; source, drain and gate via holes, formed on the sources, drains, and gates of the PMOS transistor and the NMOS transistor respectively and penetrating through the first insulating medium and the second insulating medium. The sidewall of the SOI via hole is formed with a copper diffusion barrier layer and a seed layer, the inside thereof is filled with copper, the top thereof is formed with an adhesion layer/seed layer laminated film and micro bumps, and the bottom thereof is formed with an adhesion layer/seed layer laminated film and a C4 bump. The bottoms and sidewalls of the source, drain and gate via holes are formed with a copper diffusion barrier layer and a seed layer, the inside there of is filled with copper, and the top thereof is formed with an adhesion layer/seed layer laminated film and micro humps.

In the SOI active interposer for three-dimensional packaging of the present invention, preferably, the first insulating medium and the second insulating medium are silicon dioxide, silicon nitride, SiOCH or SiOCFH.

In the SOI active interposer for three-dimensional packaging of the present invention, preferably, the copper diffusion barrier layer is at least one of TaN, TiN, ZrN, and $MnSiO_3$.

In the SOI active interposer for three-dimensional packaging of the present invention, preferably, the seed layer is at least one of Cu, Co, and Ru.

Embodiments of the invention also disclose a method for fabricating an SOI active interposer for three-dimensional packaging, comprising the following steps: providing an SOI substrate including a silicon substrate, a silicon dioxide and a top silicon; producing a CMOS inverter on the surface of the SOI substrate, the CMOS inverter including a PMOS transistor and an NMOS transistor; forming a first insulating medium to cover the PMOS transistor and the NMOS transistor; performing photolithography and etching on an area between the PMOS transistor and the NMOS transistor, until a part of the silicon substrate is etched away; forming a second insulating medium on the resulting structure; performing photolithography and etching to remove the first insulating medium and the second insulating medium on the sources, drains and gates of the PMOS transistor and the NMOS transistor so as to form source, drain and gate via holes; forming a copper diffusion harrier layer, a seed layer and copper, and removing the copper material, the seed layer and the copper diffusion barrier layer above the second insulating medium by a chemical mechanical polishing process; forming a top adhesion layer/seed layer laminated film and micro bumps; thinning the silicon substrate on the back of the SOI substrate by a combined process of mechanical grinding and chemical mechanical polishing, so that the bottom of the copper is exposed, and forming a bottom adhesion layer/seed layer laminated film and a C4 bump.

In the method for fabricating an SOI active interposer for three-dimensional packaging of the present invention, it is preferable that the first insulating medium and the second insulating medium are silicon dioxide, silicon nitride, SiOCH or SiOCFH.

In the method for fabricating an SOI active interposer for three-dimensional packaging of the present invention, it is preferable that the copper diffusion barrier layer is at least one of TaN, TiN, ZrN, and $MnSiO_3$.

In the method for fabricating an SOI active interposer for three-dimensional packaging of the present invention, it is preferable that the seed layer is at least one of Cu, Co and Ru.

The invention adopts SOI as the substrate for fabricating the active interposer, and makes the CMOS inverter on the top silicon of the SOI, so that the short channel effect and the latched-up effect can be suppressed. In addition, the SOI substrate between the PMOS and NMOS transistors of the CMOS inverter is etched to form a via hole structure, which, on the one hand, can be used as a conductive channel between the chips in the vertical direction, and on the other hand, can be used as an electrical isolation layer between the PMOS transistor and the NIMOS transistor and function like a short trench isolation (STI).

DETAILED DESCRIPTION OF THE INVENTION

Figure 1:
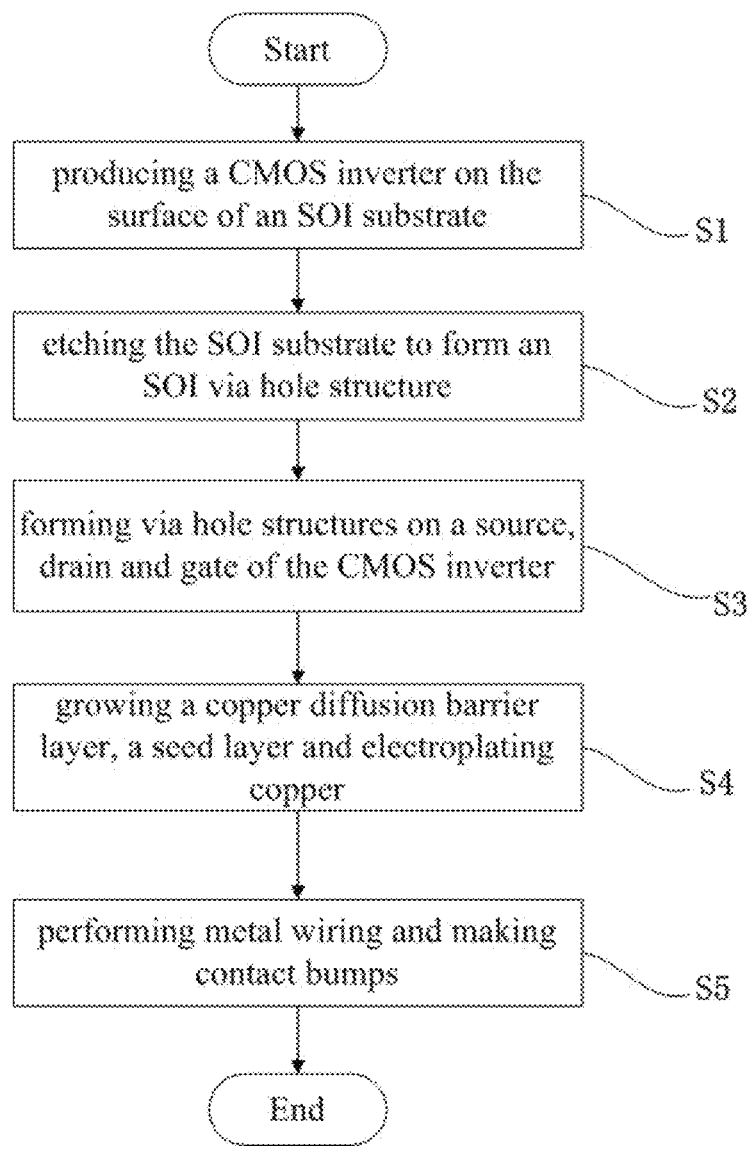
FIG. 1 is a flow chart of a method for fabricating an SOI active interposer for three-dimensional packaging.

In order to make the objectives, technical solutions and advantages of the present invention clearer, the following will clearly and completely describe the technical solutions in the embodiments of the present invention with reference to the accompanying drawings in the embodiments of the present invention. It should be understood that the specific embodiments described here are only used to explain the present invention, not to limit the present invention. The described embodiments are only a part of the embodiments of the present invention, rather than all the embodiments. Based on the embodiments of the present invention, all other embodiments obtained by those of ordinary skill in the art without creative work shall fall within the protection scope of the present invention.

In the description of the present invention, it should be noted that the orientation or positional relationship indicated by the terms "upper", "lower", "vertical", "horizontal", and the like is based on the orientation or positional relationship shown in the drawings, and is only for convenient description of the present invention and simplify the description, rather than indicating or implying that the device or element referred to must have a specific orientation, or must be constructed and operated in a specific orientation, and therefore cannot be understood as a limitation of the present invention. In addition, the terms "first" and "second" are only used for descriptive purposes, and cannot be understood as indicating or implying relative importance.

In addition, many specific details of the present invention are described below, such as the structure, materials, dimensions, processing method and technology of the device, in order to understand the present invention more clearly. However, as those skilled in the art can understand, the present invention may not be implemented according to these specific details. Unless specifically indicated in the following, each part of the device may be made of materials known to those skilled in the art, or materials with similar functions developed in the future.

The technical solution of the present invention will be further described below in combination with FIGS. 1 to 13 and embodiments.

Figure 2:
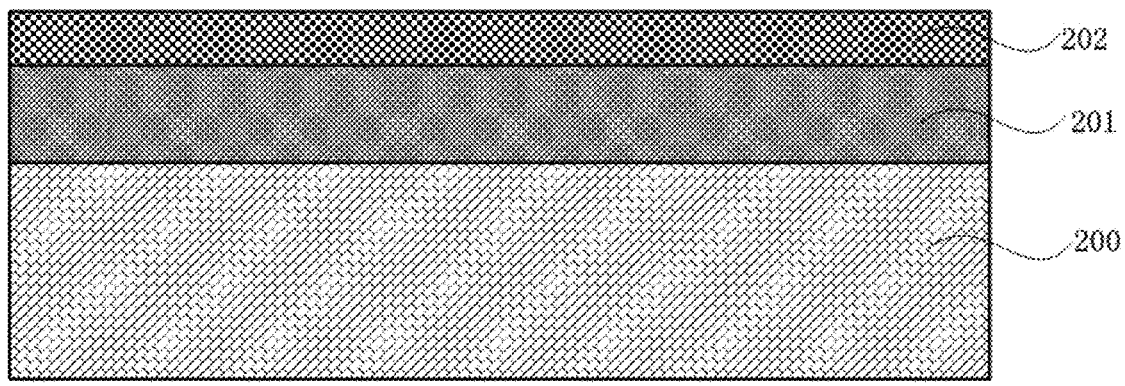
FIGS. 2-13 are schematic structural diagrams of the steps of the method for fabricating SOI active interposer for three-dimensional packaging.
Figure 3:
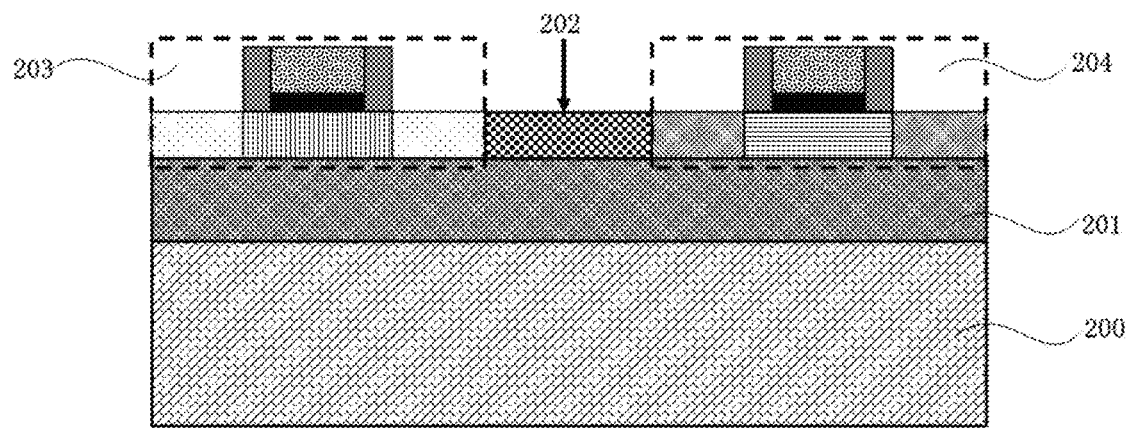

FIG. 1 is a flow chart of a method for fabricating an SOI (Silicon-On-Insulator) active interposer for three-dimensional packaging, and FIGS. 2-13 show schematic structural diagrams of the steps of the method for fabricating an SOI active interposer for three-dimensional packaging. As shown in FIG. 1, the specific fabrication steps are:

Step S1: producing a CMOS inverter on the surface of an SOI substrate. An SOI substrate with a p-type doped single crystal silicon substrate 200 and p-type doped top single crystal silicon 202 is chosen as a substrate, and the obtained structure is shown in FIG. 2. The material between the silicon substrate 200 and the top silicon 202 is silicon dioxide 201, and the thickness of the top silicon 202 ranges from 100 to 400 nm. Next, a CMOS inverter is fabricated on the surface of the top silicon 202 by using standard integrated circuit processes such as photolithography, etching, ion implantation, and sputtering, and a structure as shown in FIG. 3 is obtained. In FIG. 3, a device structure circled by dotted lines is a PMOS transistor 203 and an NMOS transistor 204, and the TOMOS transistor 203 and the NMOS transistor 204 form a CMOS inverter. In this embodiment, the silicon substrate and the top silicon are both p-type doped, but the present invention is not limited to this, and an n-type doping may also be used. Using SOI as the substrate for fabricating the active interposer, and fabricating the CMOS inverter on the top silicon of the SOI, the short channel effect and the latch-up effect can be suppressed.

Figure 4:
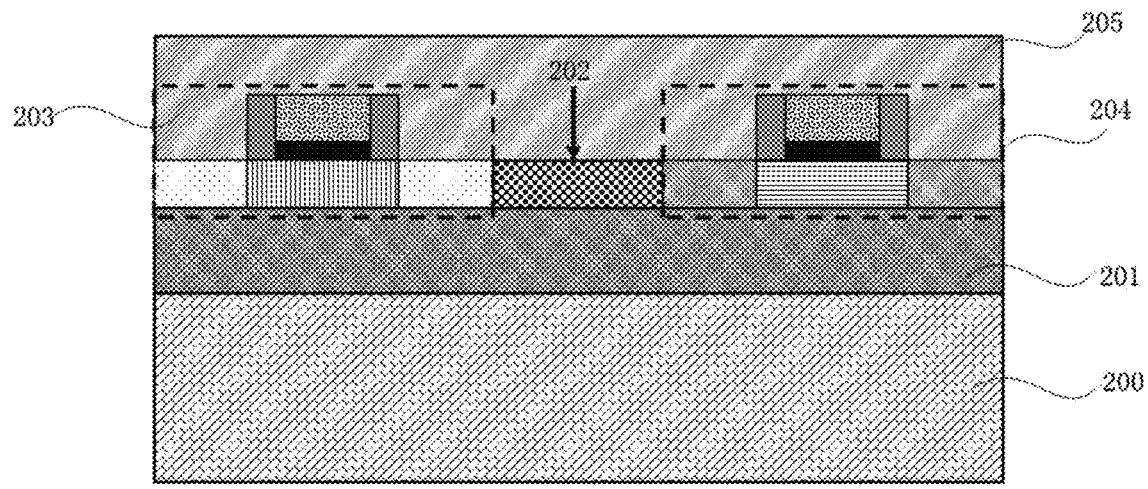
Figure 5:
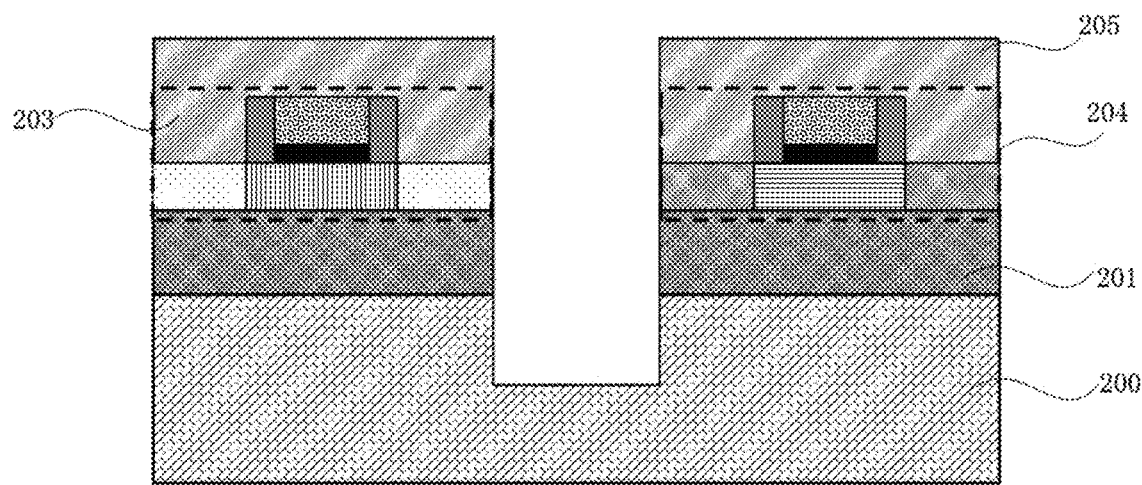

Step S2: etching the SOI substrate to form an SOI via hole structure. First, a chemical vapor deposition process is used to grow a layer of silicon dioxide as the first insulating medium 205 on the surface of the above-mentioned structure, the first insulating medium 205 completely covering the CMOS inverter. The resulting structure is shown in FIG. 4. Then, photoresist is spin-coated, and a pattern of the SOI via hole structure is defined through exposure and development processes. Next, a deep reactive ion etching (DRIE) process is used to etch an SOI region between the PMOS and NMOS transistors until a part of the silicon substrate 200 is etched away. Finally, the photoresist is dissolved in a solvent or is ached, and the resulting structure is shown in FIG. 5. On the one hand, the via hole structure can be used as a conductive channel to connect chips in a vertical direction, and on the other hand, it can be used as an electrical isolation layer between the PMOS transistor and the NMOS transistor, acting like a short trench isolation (STI). The plasma used to etch the silicon dioxide 202 and the first insulating medium 205 can be $CF_4$, $CHF_3$, $CF_4/CHF_3$, $CF_4/O_2$ or $CHF_3/O_2$, and for the top silicon 203 and the silicon substrate 200, at least one of $CF_4$ and $SF_6$ can be chosen.

Figure 6:
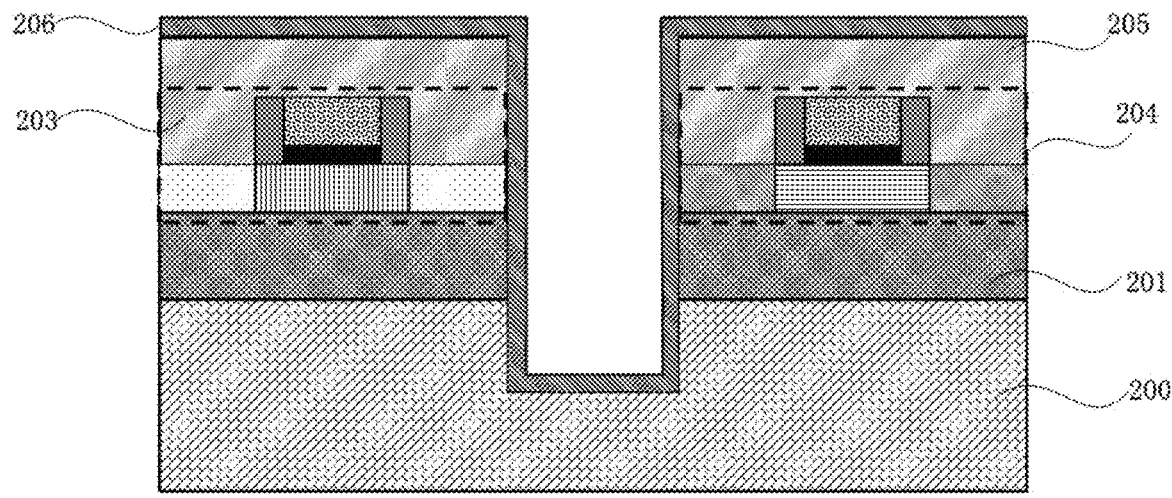
Figure 7:
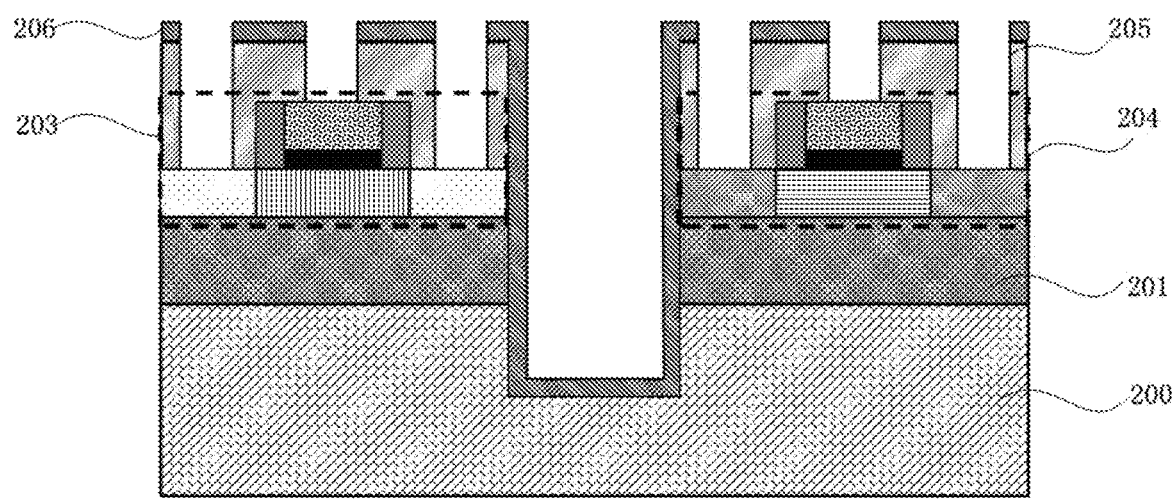

Step S3: forming via hole structures on a source, drain and gate of the CMOS inverter. First, a chemical vapor deposition process is used to grow a layer of silicon dioxide as the second insulating medium 206 on the surface of the above structure, with a thickness ranging from 200 to 500 nm, so that the surface of the SOI via hole will be covered with a layer of the second insulating medium 206. This second insulating medium can be used as an isolation layer between the PMOS transistor and the NMOS transistor, and also as an isolation layer of the CMOS inverter and the silicon substrate from metal interconnection lines. The resulting structure is shown in FIG. 6. Then, photoresist is spin-coated, and patterns of the via holes of the source, drain and gate of the CMOS inverter are defined through exposure and development processes. Then, the first insulating medium 205 and the second insulating medium 206 are etched by a DRIE process until the source, drain and gate are exposed. The resulting structure is shown in FIG. 7. In the present invention, silicon dioxide is used as the insulating medium, but the present invention is not limited to this, and silicon dioxide, silicon nitride, low dielectric constant materials (such as SiOCH, SiOCFH), etc. can be selected.

Figure 8:
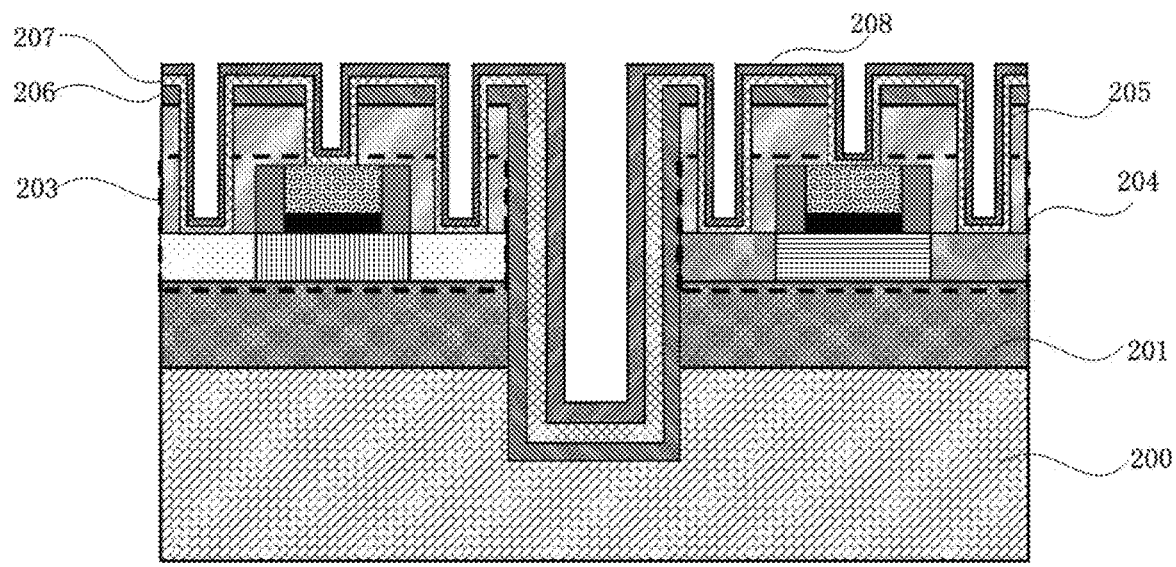
Figure 9:
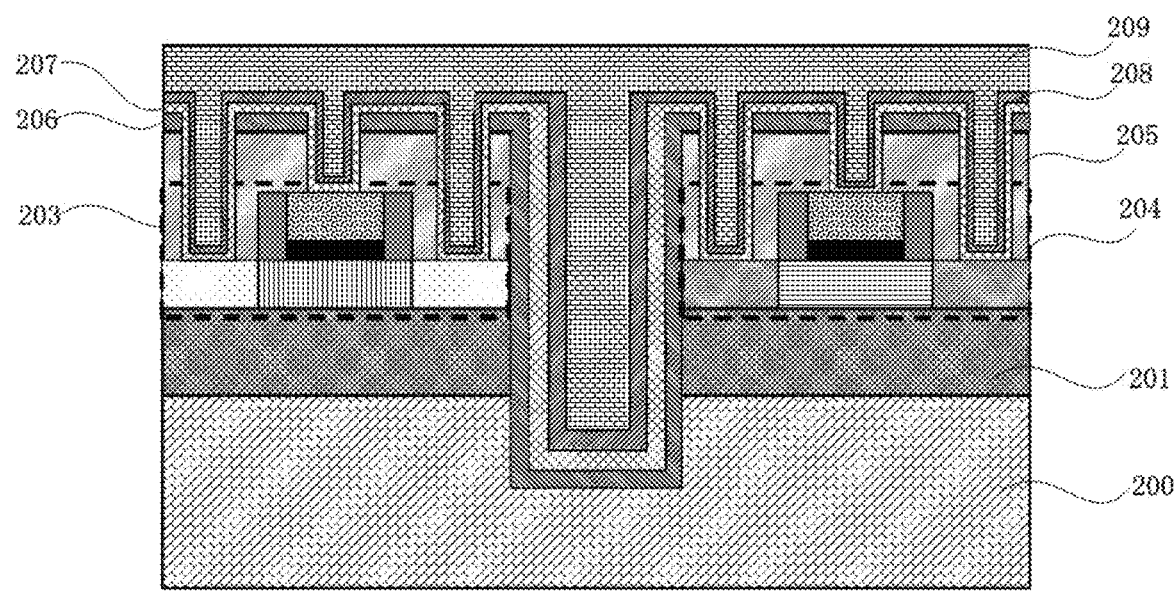
Figure 10:
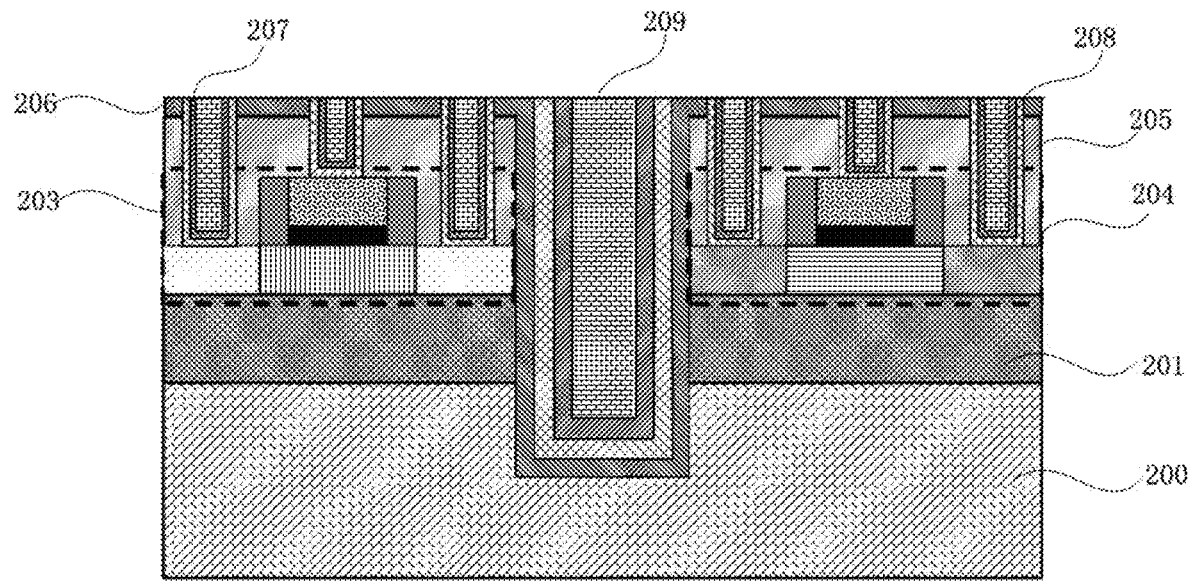

Step S4: depositing a copper diffusion barrier layer, a seed layer, and electroplating copper. First, a physical vapor deposition method is used to sequentially grow a TaN film and a Cu film inside the SOI via hole and the source, drain and gate via holes as the copper diffusion barrier layer 207 and the seed layer 208 respectively. The resulting structure is shown in FIG. 8. Then, the Cu film is used as a seed layer, and the copper material 209 is electroplated on it by an electroplating process. The copper material 209 completely fills the SOI via hole and the source, drain and gate via holes. The resulting structure is shown in FIG. 9. Finally, a chemical mechanical polishing process is used to remove the copper material 209, the Cu seed layer 208 and the TaN copper diffusion barrier layer 207 above the second insulating medium 206. The resulting structure is shown in FIG. 10. In this embodiment, TaN is used as the copper diffusion barrier layer and Cu is used as the seed layer, but the present invention is not limited to this. At least one of TaN, TiN, ZrN, and $MnSiO_3$ can be selected as the copper diffusion barrier layer, and at least one of Cu, Co and Ru can be selected as the seed layer. For the growth modes of the copper diffusion barrier layer and the seed layer, at least one of physical vapor deposition, chemical vapor deposition, and atomic layer deposition can be selected.

Figure 11:
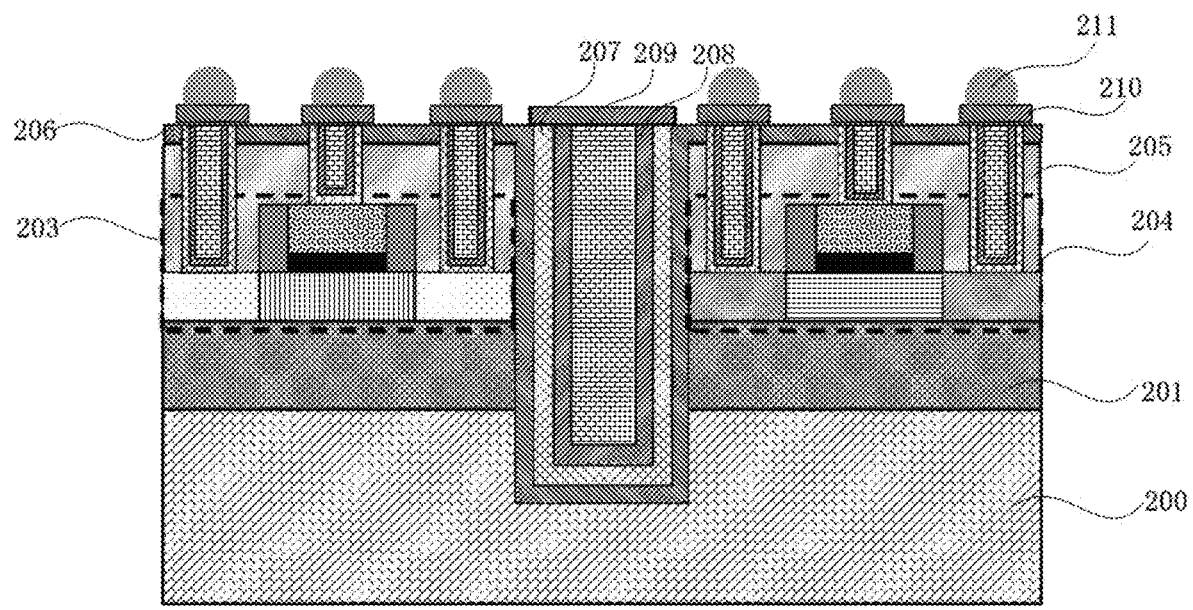
Figure 12:
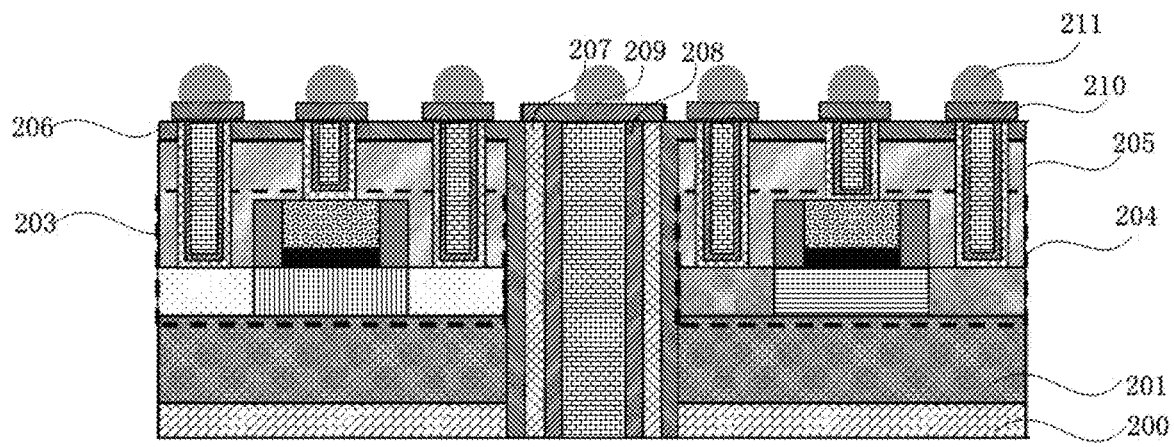

Step S5: performing metal wiring and making contact bumps. First, a laminated film 210 composed of a Ti film and a Cu film is grown on the surface of the above-mentioned structure by physical vapor deposition. The Ti film and the Cu film serve as adhesion layer and seed layer, respectively. Then, the surface of the adhesion layer/seed layer laminated film 210 is electroplated with a laminated metal composed of Cu material and Sn material as the micro bumps 211 by electroplating. Then, photolithography and etching processes are used to remove unnecessary adhesion layer/seed layer laminated film 210 to ensure that there is no conduction between adjacent micro bumps. The resulting structure is shown in FIG. 11. Thereafter, a combined process of mechanical grinding and chemical mechanical polishing is used to thin the silicon substrate on the back of the SOI substrate so that the bottom of the copper material 209 is exposed. The resulting structure is shown in FIG. 12. Finally, the adhesion layer/seed layer laminated film 212 and a C4 bump 213 are sequentially fabricated on the bottom of the copper material 209 by using the same process as the micro bumps 211, and the resulting structure is shown in FIG. 13.

Figure 13:
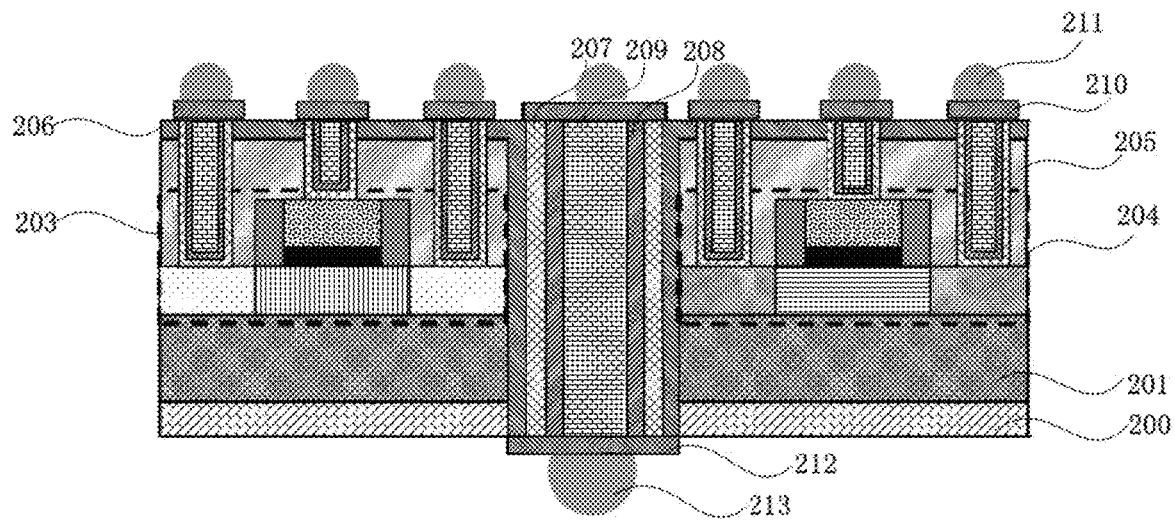

As shown in FIG. 13, the SOI active interposer for three-dimensional packaging of the present invention comprises the 501 substrate; the CMOS inverter, including the PMOS transistor 203 and the NMOS transistor 204 and formed on the SOI substrate; the SOI via hole, formed between the PMOS transistor 203 and the NMOS transistor 204 and penetrating through the SOI substrate; the first insulating medium 205, covering the PMOS transistor 203 and the NMOS transistor 204; the second insulating medium 206, formed on the sidewall of the SOI via hole and the surface of the first insulating medium 205; source, drain and gate via holes, formed on the sources, drains and gates of the PMOS transistor 203 and the CMOS transistor 204, respectively, and penetrating through the first insulating medium 205 and the second insulating medium 206. The sidewall of the SOI via hole is formed with the copper diffusion barrier layer 207 and the seed layer 208, the inside thereof is filled with copper 209, the top thereof is formed with an adhesion layer/seed layer laminated film 210 and micro bumps 211, and the bottom thereof is formed with an adhesion layer/seed layer laminated film 212 and a C4 bump 213. The bottoms and sidewalk of the source, drain and gate via holes are formed with a copper diffusion barrier layer 207 and a seed layer 208, the insides thereof are filled with copper 209, and the tops thereof are formed with an adhesion layer/seed layer laminated film 210 and micro bumps 211.

Preferably, the first insulating medium and the second insulating medium are silicon dioxide, silicon nitride, SiOCH, SiOCFH, or the like. Preferably, the copper diffusion harder layer is at least one of TaN, TiN, ZrN, and $MnSiO_3$. Preferably, the seed layer is at least one of Cu, Co, and Ru.

The above are only specific embodiments of the present invention, but the scope of protection of the present invention is not limited thereto. Any changes or substitutions easily occurred to those skilled in the art within the technical scope disclosed by the present invention should be covered within the protection scope of the present invention.

What is claimed is:

1. An SOI active interposer for three-dimensional packaging, comprising:
   an SOI substrate;
   a CMOS inverter, including a PMOS transistor and an NMOS transistor and formed on the SOI substrate;
   an SOI via hole formed between the PMOS transistor and the NMOS transistor and penetrating through the SOI substrate;
   a first insulating medium covering the PMOS transistor and the NMOS transistor;
   a second insulating medium formed on the sidewall of the SOI via hole and the surface of the first insulating medium; and
   source, drain and gate via holes respectively formed on a source, drain and gate of the PMOS transistor and the NMOS transistor, and penetrating through the first insulating medium and the second insulating medium;
   wherein the second insulating medium is disposed on the first insulating medium and in direct contact with the first insulating medium, and the side wall of the SOI via hole is continuously covered by the second insulating medium;
   wherein the sidewall of the SOI via hole is formed with a copper diffusion barrier layer and a seed layer, the inside thereof is filled with copper, the top thereof is formed with an adhesion layer/seed layer laminated film and a micro bump, and the bottom thereof is formed with an adhesion layer/seed layer laminated film and a C4 bump; and
   the bottoms and the sidewalls of the source, drain and gate via holes are formed with a copper diffusion barrier layer and a seed layer, the insides thereof are filled with copper, and the tops thereof are formed with an adhesion layer/seed layer laminated film and micro bumps.

2. The SOI active interposer for three-dimensional packaging according to claim 1, wherein:
   the first insulating medium and the second insulating medium are silicon dioxide, silicon nitride, SiOCH or SiOCFH.

3. The SOI active interposer for three-dimensional packaging according to claim 1, wherein:
   the copper diffusion barrier layer is at least one of TaN, TiN, ZrN, and $MnSiO_3$.

4. The SOI active interposer for three-dimensional packaging according to claim 1, wherein:
   the seed layer is at least one of Cu, Co and Ru.

5. A method for fabricating an SOI active interposer for three-dimensional packaging, comprising:
   providing an SOI substrate including a silicon substrate, a silicon dioxide and a top silicon;
   producing a CMOS inverter on the surface of the SOI substrate, the CMOS inverter including a PMOS transistor and an NMOS transistor;
   forming a first insulating medium to cover the PMOS transistor and the NMOS transistor;

performing photolithography and etching on an area between the PMOS transistor and the NMOS transistor until a part of the silicon substrate is etched away;

forming a second insulating medium on the resulting structure;

removing the first insulating medium and the second insulating medium on the sources, drains and gates of the PMOS transistor and the NMOS transistor by photolithography and etching to form source, drain and gate via holes;

forming a copper diffusion barrier layer, a seed layer and copper, and removing the copper, the seed layer and the copper diffusion barrier layer above the second insulating medium by a chemical mechanical polishing process;

forming a top adhesion layer/seed layer laminated film and micro bumps; and thinning the silicon substrate on the back of the SOI substrate by a combined process of mechanical grinding and chemical mechanical polishing, so that the bottom of the copper is exposed to form a bottom adhesion layer/seed layer laminated film and a C4 bump;

wherein the second insulating medium is disposed on the first insulating medium and in direct contact with the first insulating medium, and the side wall of the SOI via hole is continuously covered by the second insulating medium.

6. The method for fabricating an SOI active interposer for three-dimensional packaging according to claim 5, wherein:
the first insulating medium and the second insulating medium are silicon dioxide, silicon nitride, SiOCH or SiOCFH.

7. The method for fabricating an SOI active interposer for three-dimensional packaging according to claim 5, wherein:
the copper diffusion barrier layer is at least one of TaN, TiN, ZrN, and $MnSiO_3$.

8. The method for fabricating an SOI active interposer for three-dimensional packaging according to claim 5, wherein:
the seed layer is at least one of Cu, Co and Ru.

* * * * *